United States Patent
Okamoto et al.

(10) Patent No.: US 11,869,797 B2
(45) Date of Patent: Jan. 9, 2024

(54) ELECTROSTATIC CHUCK AND METHOD OF MANUFACTURING ELECTROSTATIC CHUCK

(71) Applicant: SHINKO ELECTRIC INDUSTRIES CO., LTD., Nagano (JP)

(72) Inventors: Naomi Okamoto, Nagano (JP); Ryuji Takahashi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 17/743,003

(22) Filed: May 12, 2022

(65) Prior Publication Data
US 2022/0367227 A1 Nov. 17, 2022

(30) Foreign Application Priority Data
May 13, 2021 (JP) .................. 2021-081909

(51) Int. Cl.
 *H01T 23/00* (2006.01)
 *H01L 21/683* (2006.01)
 *B33Y 80/00* (2015.01)
 *B33Y 10/00* (2015.01)
(52) U.S. Cl.
 CPC .......... *H01L 21/6833* (2013.01); *B33Y 10/00* (2014.12); *B33Y 80/00* (2014.12)

(58) Field of Classification Search
 None
 See application file for complete search history.

(56) References Cited

U.S. PATENT DOCUMENTS

| 2007/0199660 A1* | 8/2007 | Yokoyama | H01L 21/6833 438/689 |
| 2013/0321974 A1 | 12/2013 | Kuribayashi | |
| 2015/0077895 A1* | 3/2015 | Jindo | C04B 35/645 228/121 |
| 2022/0139681 A1* | 5/2022 | Erickson | H01J 37/32715 361/234 |

FOREIGN PATENT DOCUMENTS

JP 2013-247342 12/2013

* cited by examiner

*Primary Examiner* — Stephen W Jackson
(74) *Attorney, Agent, or Firm* — Rankin, Hill & Clark LLP

(57) ABSTRACT

An electrostatic chuck includes a base plate that is made of a metal; a ceramic plate that is fixed to the base plate and configured to adsorb an object by electrostatic force; and a bonding layer that is provided between the base plate and the ceramic plate to bond the base plate and the ceramic plate to each other. The bonding layer is formed of a composite material including the metal forming the base plate and a ceramic forming the ceramic plate.

8 Claims, 5 Drawing Sheets

ELECTROSTATIC CHUCK AND METHOD OF MANUFACTURING ELECTROSTATIC CHUCK

This application claims priority from Japanese Patent Applications No. 2021-081909, filed on May 13, 2021, the entire contents of which are herein incorporated by reference.

BACKGROUND

Technical Field

The present disclosure relates to an electrostatic chuck and a method for manufacturing the electrostatic chuck.

Background Art

Electrostatic chucks (ESC) that adsorb and retain wafers thereon may be used, for example, in order to manufacture semiconductor components. Such an electrostatic chuck is configured so that a ceramic plate in which an electrode is built is adhesively bonded to a base plate made of metal. Due to a voltage applied to the electrode built in the ceramic plate, a wafer is adsorbed on the ceramic plate by use of electrostatic force.

The ceramic plate is adhesively bonded to the base plate by an adhesive agent such as a silicone resin-based adhesive agent. Specifically, the ceramic plate is temporarily adhesively bonded to the base plate by the adhesive agent that is in an uncured state. Then, when the adhesive agent in the uncured state is thermally cured, the ceramic plate is adhesively bonded to the base plate (see e.g., JP-A-2013-247342).

By the way, the adhesive agent adhesively bonding the base plate and the ceramic plate to each other contracts in a cooling process after the thermal curing. On this occasion, the adhesive agent under an outer circumferential portion of the ceramic plate is easily deprived of heat by a surrounding atmosphere to thereby contract more than the adhesive agent under a central portion of the ceramic plate. As a result, thickness of the adhesive agent under the outer circumferential portion of the ceramic plate becomes thinner, so that the ceramic plate is adhesively bonded in a deflected state with a shape where the ceramic plate is high in and around the central portion and low in the outer circumferential portion.

The ceramic plate adhesively bonded in such a deflected state causes a variation in height of an adsorption face of the electrostatic chuck (i.e., an adsorption face of the ceramic plate). To solve this problem, the adsorption face of the ceramic plate in such an electrostatic chuck is generally made flat by polishing.

However, when the adsorption face of the ceramic plate is polished, thickness of the ceramic plate becomes non-uniform. That is, the thickness becomes thinner in and around the central portion of the ceramic plate. When the electrostatic chuck is used in this condition, a heat transfer characteristic between the base plate and the ceramic plate through the adhesive agent may be non-uniform so that temperature of the adsorption face of the ceramic plate cannot be sufficiently uniform.

SUMMARY

Certain embodiment provides an electrostatic chuck. The electrostatic chuck includes: a base plate that is made of a metal; a ceramic plate that is fixed to the base plate and configured to adsorb an object by electrostatic force; and a bonding layer that is provided between the base plate and the ceramic plate to bond the base plate and the ceramic plate to each other. The bonding layer is formed of a composite material including the metal forming the base plate and a ceramic forming the ceramic plate.

Certain embodiment provides a method of manufacturing an electrostatic chuck. The method includes: preparing a base plate made of a metal; providing a bonding layer on the base plate by 3D printing, wherein the bonding layer is formed of a composite material including the metal and a ceramic; and providing a ceramic plate on the bonding layer by 3D printing. The ceramic plate includes: a first electrode configured to adsorb an object by electrostatic force according to a voltage applied to the first electrode; a second electrode configured to generate heat according to a voltage applied to the second electrode; and a ceramic surrounding the first electrode and the second electrode.

DETAILED DESCRIPTION OF EMBODIMENT

An embodiment of an electrostatic chuck and a method for manufacturing the electrostatic chuck disclosed by the present application will be described below in detail based on the drawings. Incidentally, technology disclosed herein is not limited by the embodiment.

Embodiment

[Configuration of Electrostatic Chuck]

Figure 1:
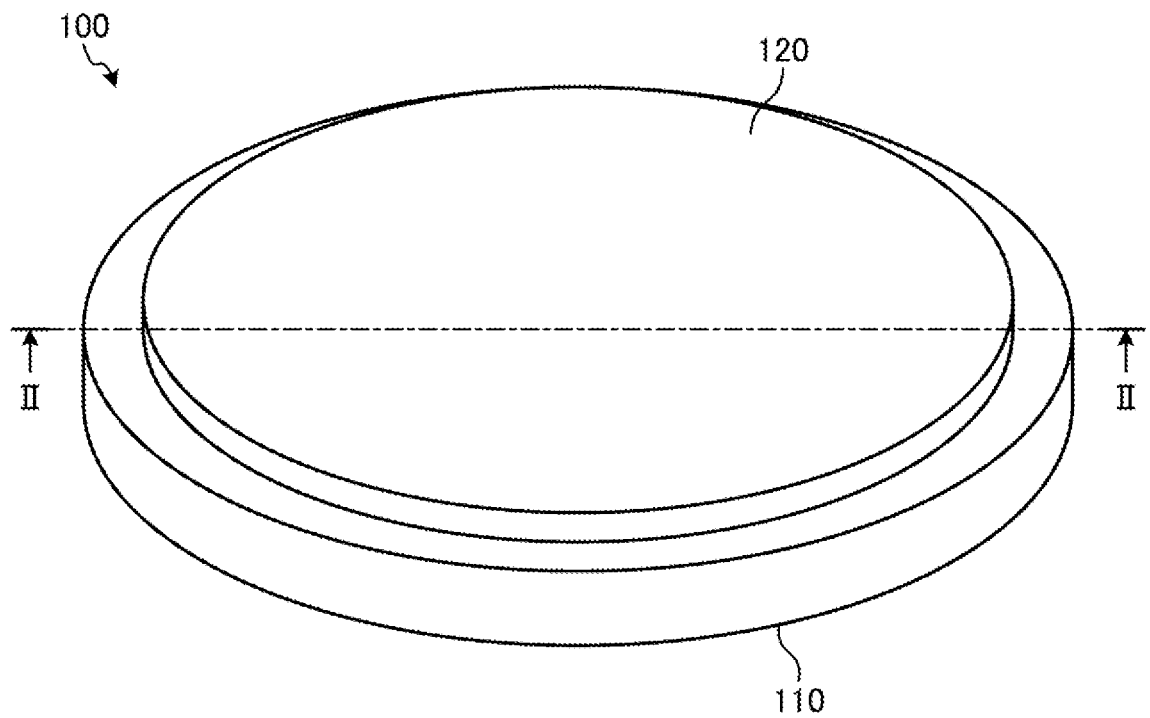
FIG. 1 is a perspective view showing a configuration of an electrostatic chuck according to an embodiment.

FIG. 1 is a perspective view showing a configuration of an electrostatic chuck 100 according to an embodiment. The electrostatic chuck 100 shown in FIG. 1 has a structure in which a ceramic plate 120 is bonded to a base plate 110.

The base plate 110 is a circular member made of metal such as aluminum. The base plate 110 serves as a base material of the electrostatic chuck 100. A refrigerant channel through which a refrigerant such as cooling water is passed is formed inside the base plate 110 to adjust temperatures of the ceramic plate 120 and a wafer or the like adsorbed on the ceramic plate 120.

The ceramic plate 120 is a circular member made of insulating ceramic. The diameter of the ceramic plate 120 is smaller than the diameter of the base plate 110. The ceramic plate 120 is fixed to the center of the base plate 110. That is, one face of the ceramic plate 120 serves as a bonding face bonded to the base plate 110. The bonding face is bonded to the base plate 110 through a bonding layer made of a composite material of the metal and the ceramic so that the ceramic plate 120 is fixed to the base plate 110. Of the ceramic plate 120, a face opposite to the bonding face is an adsorption face that can adsorb an object to be adsorbed, such as the wafer.

An electrically conductive electrode is disposed inside the ceramic plate 120. When electric power is supplied to the electrode, electrostatic force is generated. By the electrostatic force, the object is adsorbed on the adsorption face of the ceramic plate 120.

In addition, a heater electrode is disposed inside the ceramic plate 120. Due to the electric power supplied to the heater electrode, the heater electrode generates heat to adjust the temperatures of the ceramic plate 120 and the object such as the wafer that is adsorbed on the ceramic plate 120.

Figure 2:
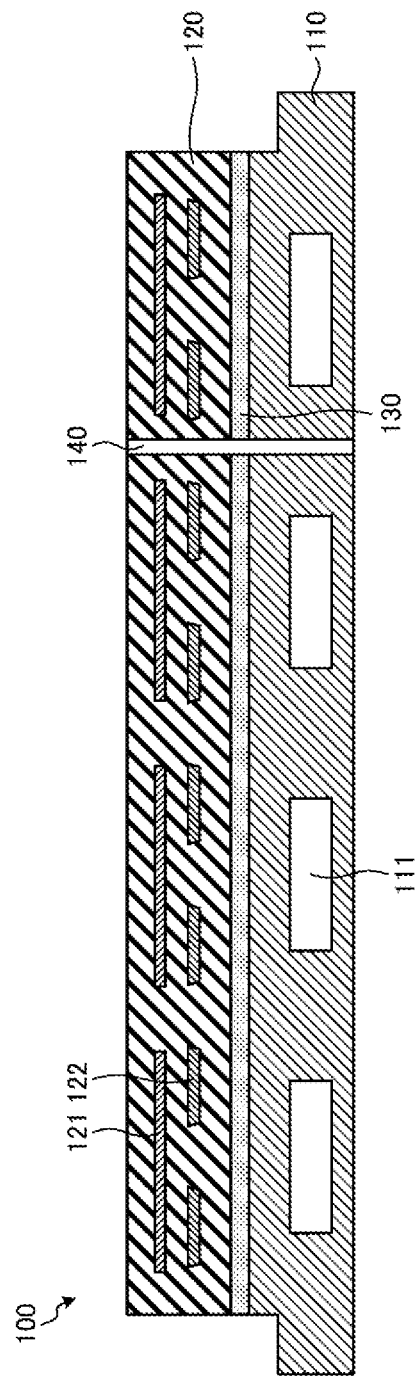
FIG. 2 is a schematic view showing a section of the electrostatic chuck according to the embodiment.

FIG. 2 shows a schematic view showing a section of the electrostatic chuck according to the embodiment. A sectional view taken along a line II-II of FIG. 1 is shown in FIG. 2. As shown in FIG. 2, the electrostatic chuck 100 has the configuration in which the ceramic plate 120 is bonded to the base plate 110 by the bonding layer 130.

The base plate 110 is, for example, a member that is made of metal to be about 20 to 50 mm thick, and that internally has the refrigerant channel 111 serving as a channel through which a refrigerant such as cooling water or cooling gas passes. Due to the refrigerant passing through the refrigerant channel 111, the ceramic plate 120 and the wafer adsorbed on the ceramic plate 120 are cooled. As a result of cooling the ceramic plate 120, the object such as the wafer, that is adsorbed on the ceramic plate 120 is cooled.

The ceramic plate 120 is made of ceramic inside which the electrode 121 and the heater electrode 122 are provided. The ceramic plate 120 is, for example, about 4.5 mm thick. The ceramic is obtained, for example, by 3D printing using aluminum oxide. A lower face of the ceramic plate 120 that is the bonding face bonded to the base plate 110 is bonded to an upper face of the base plate 110 by the bonding layer 130.

The electrode 121 is configured to adsorb the object by electrostatic force according to a voltage applied to the electrode 121. That is, when the voltage is applied to the electrode 121 of the ceramic plate 120, the ceramic plate 120 adsorbs the object such as the wafer by the electrostatic force. In FIG. 2, an upper face of the ceramic plate 120 is the adsorption face, and the object is adsorbed on the adsorption face when the voltage is applied to the electrode 121.

In addition, when the voltage is applied to the heater electrode 122 of the ceramic plate 120, the heater electrode 122 generates heat so as to heat the ceramic plate 120 and therefore heat the object adsorbed by the ceramic plate 120. The temperature of the ceramic plate 120 is adjusted by the heating made by the heater electrode 122 and the cooling made by the base plate 110. As a result, the temperature of the object adsorbed on the ceramic plate 120 is adjusted to a desired temperature.

An alloy such as CN49 (constantan)(Cu—Ni—Mn—Fe alloy), Zeranin (Cu—Mn—Sn alloy) or Manganin (Cu—Mn—Ni alloy) can be used as the material of the heater electrode 122. In addition, thickness of the heater electrode 122 can be, for example, set in a range of about 25 μm to 50 μm.

The bonding layer 130 is a layer made of a composite material of the metal forming the base plate 110 and the ceramic forming the ceramic plate 120. The bonding layer 130 bonds the lower face of the ceramic plate 120 to the upper face of the base plate 110. The bonding layer 130 is, for example, obtained by 3D printing using the composite material of the metal forming the base plate 110 and the ceramic forming the ceramic plate 120. The composite material of the metal and the ceramic is uniformly provided on the base plate 110 made of the metal during formation by the 3D printing. As a result, thickness of the entire bonding layer 130 is substantially uniform. That is, the bonding layer 130 does not require thermal curing and a cooling process after the thermal curing like an adhesive agent such as a silicone resin-based adhesive agent during the formation. Accordingly, the thickness is substantially uniform over the entire area of the bonding layer 130. A difference in the thickness between a thickest portion and a thinnest portion in the entire area of the bonding layer 130 is, for example, smaller than a difference in thickness of the adhesive agent. Therefore, a heat transfer characteristic between the base plate 110 and the ceramic plate 120 through the bonding layer 130 is so uniform that the entire area of the ceramic plate 120 can be uniformly cooled by the base plate 110. As a result, a temperature difference in the adsorption face of the ceramic plate 120 is so small that the electrostatic chuck 100 can obtain sufficiently high heat uniformity.

Incidentally, it can be said that the thickness of the bonding layer 130 is substantially uniform when a difference between a maximum value and a minimum value in the thickness of the bonding layer 130 is within a range of 0 μm to 100 μm. More preferably, it can be said that the thickness of the bonding layer 130 is substantially uniform when the difference between the maximum value and the minimum value in the thickness of the bonding layer 130 is within a range of 0 μm to 50 μm.

Any desirable ratio can be used as a composite ratio of the ceramic to the metal in the composite material forming the bonding layer 130. For example, the bonding layer 130 may be formed so that the composite ratio of the ceramic to the metal in the composite material increases as approaching the ceramic plate 120 along the thickness direction of the bonding layer 130. A gradient is applied to the composite material forming the bonding layer 130 so that the composite ratio of the ceramic increases as approaching the ceramic plate 120. In this manner, generation of stress caused by a difference in coefficient of thermal expansion between the ceramic plate 120 and the base plate 110 can be reduced. Therefore, the ceramic plate 120 can be prevented from cracking due to the stress during the heating made by the heater electrode 122 or during the cooling made by the base plate 110.

Incidentally, the electrostatic chuck 100 may be provided with a gas flow path 140 which penetrates the base plate 110, the ceramic plate 120 and the bonding layer 130 in the thickness direction so that heat-transfer gas such as helium gas can flow through the gas flow path 140. An opening at one end of the gas flow channel 140 is formed in the adsorption face of the ceramic plate 120. Fine irregularities are formed in the adsorption face of the ceramic plate 120. The heat-transfer gas flowing out from the opening at the end of the gas flow path 140 can reach the surface of the object, such as the wafer, which has been adsorbed on the adsorption face of the ceramic plate 120 so that the heat-transfer gas can maintain a state suitable for processing the object.

[Method for Manufacturing Electrostatic Chuck]

Figure 3:
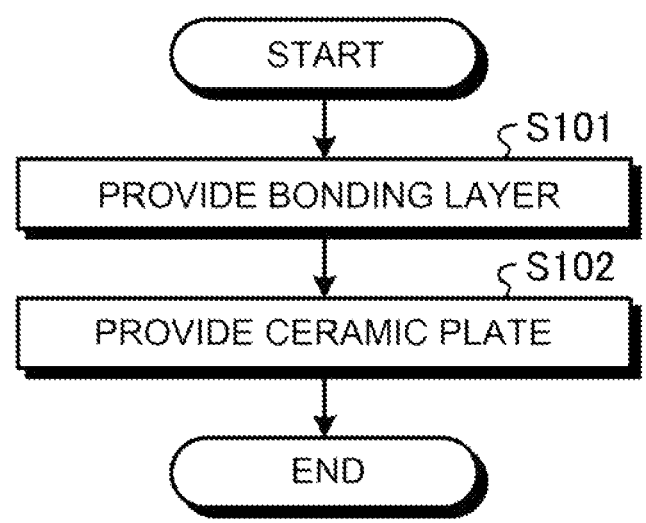
FIG. 3 is a flow chart showing a method for manufacturing the electrostatic chuck according to the embodiment.

Next, a method for manufacturing an electrostatic chuck 100 having the aforementioned configuration will be described with reference to FIG. 3. FIG. 3 is a flow chart showing the method for manufacturing the electrostatic chuck 100 according to the embodiment. Incidentally, in the following description, a step of forming a gas flow path 140 will be omitted in order to simplify the description.

Figure 4:
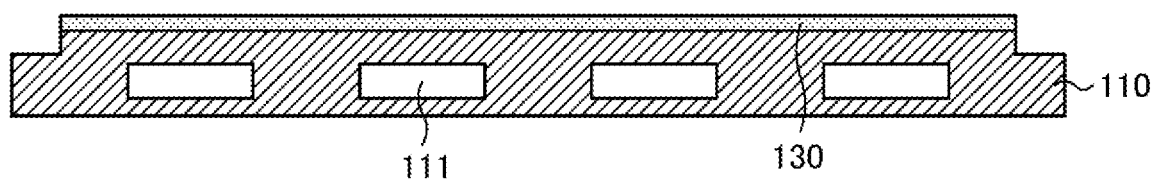
FIG. 4 is a view showing a specific example of a bonding layer providing step.

First, 3D printing is performed so as to provide a bonding layer 130 on a base plate 110 (Step S101). The bonding layer 130 is made of a composite material of metal forming the base plate 110 and ceramic. The composite material is provided with high accuracy so that, for example, a difference in thickness between a thickest portion and a thinnest portion of the bonding layer 130 is smaller than a difference in thickness between a thickest portion and a thinnest portion of an adhesive agent such as a silicone resin-based adhesive agent in a cooling process after thermal curing. As a result, the bonding layer 130 uniform in thickness is provided on the base plate 110, for example, as shown in FIG. 4. FIG. 4 is a view showing a specific example of the bonding layer providing step.

Figure 5:
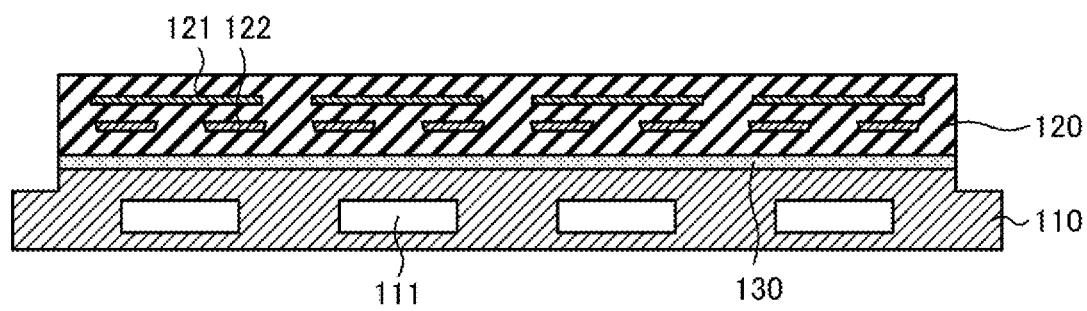
FIG. 5 is a view showing a specific example of a ceramic plate providing step.

Successively, 3D printing is performed so as to provide a ceramic plate 120 on the bonding layer 130 (step S102). The ceramic plate 120 includes an electrode 121, a heater electrode 122 and ceramic surrounding the electrode 121 and the heater electrode 122. Specifically, for example, 3D printing using powder of aluminum oxide, powder of the metal that is the material of the electrode 121, and powder of an alloy that is illustrated as an example of the material of the heater electrode 122 is performed on the surface of the bonding layer 130, so that the ceramic plate 120 is formed. On this occasion, the thickness of the bonding layer 130 is uniform because the composite material is provided with high accuracy. Therefore, thickness of the ceramic plate 120 provided on the bonding layer 130 is also uniform. As a result, the electrostatic chuck 100 in which the base plate 110, the ceramic plate 120 uniform in thickness and the bonding layer 130 are integrated is obtained, for example, as shown in FIG. 5. FIG. 5 is a view showing a specific example of the ceramic plate providing step.

In the electrostatic chuck 100, the thickness of the bonding layer 130 is uniform by the 3D printing. Therefore, sufficiently high heat uniformity can be obtained when temperature of the ceramic plate 120 is adjusted by heating from the heater electrode 122 and cooling from the base plate 110.

As described above, an electrostatic chuck (e.g., the electrostatic chuck 100) according to the embodiment has a base plate (e.g., the base plate 110) made of metal, a ceramic plate (e.g., the ceramic plate 120), and a bonding layer (e.g., the bonding layer 130). The ceramic plate is fixed to the base plate to adsorb an object by electrostatic force. The bonding layer is a bonding layer that is formed from a composite material of the metal forming the base plate and ceramic forming the ceramic plate, and that is provided between the base plate and the ceramic plate to be uniform in thickness. The bonding layer bonds the base plate and the ceramic plate to each other. Thus, sufficiently high heat uniformity can be obtained according to the electrostatic chuck according to the embodiment.

In addition, the bonding layer according to the embodiment may be formed so that a composite ratio of the ceramic to the metal in the composite material increases as approaching the ceramic plate along the thickness direction of the bonding layer. Thus, in the electrostatic chuck according to the embodiment, the ceramic plate can be prevented from cracking due to a difference in coefficient of thermal expansion between the ceramic plate and the base plate.

Moreover, the ceramic plate according to the embodiment may have a first electrode (e.g., the electrode 121) to which a voltage can be applied, a second electrode (e.g., the heater electrode 122) that generates heat due to the voltage applied thereto, and ceramic that surrounds the first electrode and the second electrode. Thus, in the electrostatic chuck according to the embodiment, sufficiently high heat uniformity can be obtained when temperature of the ceramic plate is adjusted by heating from the second electrode and cooling from the base plate.

Moreover, the ceramic plate according to the embodiment may have a refrigerant channel (e.g., the refrigerant channel 111) through which a refrigerant is passed. Thus, in the electrostatic chuck according to the embodiment, sufficiently high heat uniformity can be obtained when the temperature of the ceramic plate is adjusted by the heating from the second electrode and the cooling from the base plate.

(Modification)

Figure 6:
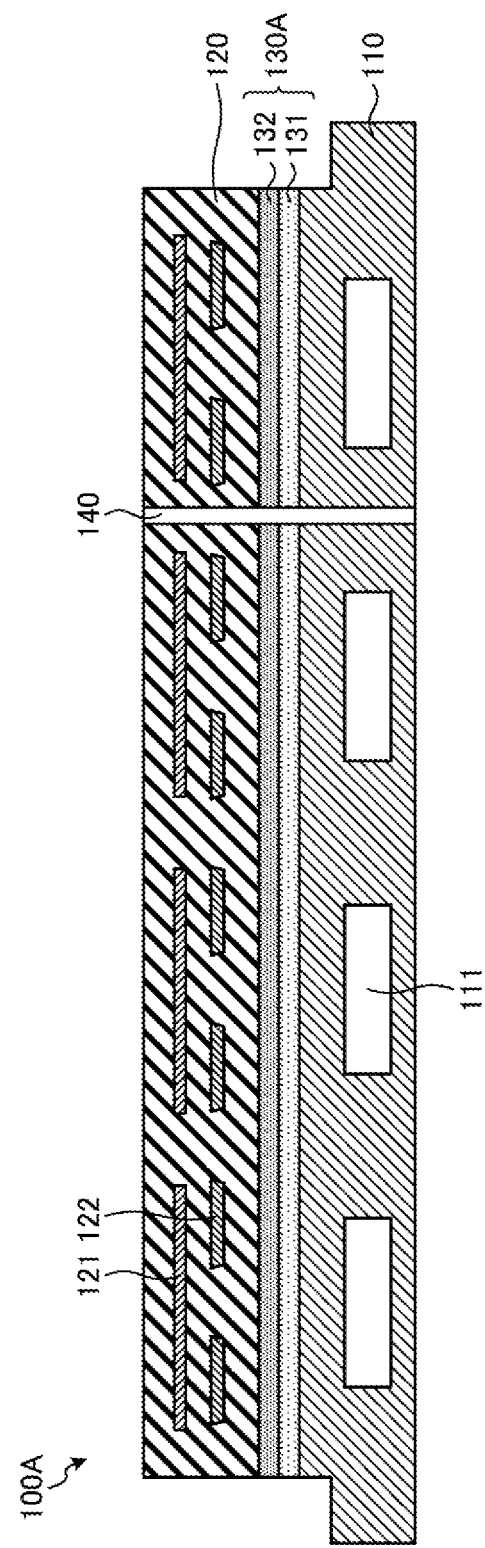
FIG. 6 is a schematic view showing a section of an electrostatic chuck according to a modification of the embodiment.

Incidentally, the case where the bonding layer 130 bonding the base plate 110 and the ceramic plate 120 to each other is formed from one layer has been shown by way of example in the aforementioned embodiment. However, a plurality of bonding layers may be formed alternatively. Specifically, a bonding layer 130A according to a modification may be formed by a first bonding layer 131 and a second bonding layer 132, for example, as shown in FIG. 6. FIG. 6 is a schematic view showing a section of an electrostatic chuck 100A according to the modification of the embodiment. The first bonding layer 131 that is formed from a first composite material of metal forming the base plate 110 and ceramic forming the ceramic plate 120 is provided on the base plate 110. The second bonding layer 132 that is formed from a second composite material of the metal forming the base plate 110 and the ceramic forming the ceramic plate 120 is provided between the first bonding layer 131 and the ceramic plate 120. The second composite material has a larger composite ratio of the ceramic to the metal than the first composite material. Thus, the ceramic plate 120 can be prevented from cracking due to a difference in coefficient of thermal expansion between the ceramic plate 120 and the base plate 110. Incidentally, a bonding layer 130A consisting of three or more bonding layers may be formed. Even in a case where the bonding layer 130A consisting of the three or more bonding layers is formed, a composite material forming each of the bonding layers can be adjusted so that a composite ratio of the ceramic increases as approaching the ceramic plate 120.

Although the preferred embodiments etc. have been described above in detail, the present disclosure is not limited to the aforementioned embodiments etc., and various modifications and substitutions can be added to the aforementioned embodiments etc. without departing from the scope described in Claims.

Various aspects of the subject matter described herein are set out non-exhaustively in the following numbered clauses:

1) A method of manufacturing an electrostatic chuck, the method comprising:

preparing a base plate made of a metal;

providing a bonding layer on the base plate by 3D printing, wherein the bonding layer is formed of a composite material including the metal and a ceramic; and providing a ceramic plate on the bonding layer by 3D printing, wherein the ceramic plate comprises:

a first electrode configured to adsorb an object by electrostatic force according to a voltage applied to the first electrode;

a second electrode configured to generate heat according to a voltage applied to the second electrode; and a ceramic surrounding the first electrode and the second electrode.

2) The method according to Clause (1),
wherein a thickness of the bonding layer is substantially uniform.

What is claimed is:

1. An electrostatic chuck comprising:
a base plate that is made of a metal;
a ceramic plate that is fixed to the base plate and configured to adsorb an object by electrostatic force; and
a bonding layer that is provided between the base plate and the ceramic plate to bond the base plate and the ceramic plate to each other, wherein the bonding layer is formed of a composite material including the metal forming the base plate and a ceramic forming the ceramic plate,
wherein the bonding layer is formed such that a composite ratio of the ceramic to the metal in the composite material increases as the bonding layer approaches the ceramic plate along a thickness direction of the bonding layer.

2. The electrostatic chuck according to claim 1,
wherein a thickness of the bonding layer is substantially uniform.

3. An electrostatic chuck comprising:
a base plate that is made of a metal;
a ceramic plate that is fixed to the base plate and configured to adsorb an object by electrostatic force; and
a bonding layer that is provided between the base plate and the ceramic plate to bond the base plate and the ceramic plate to each other, wherein the bonding layer is formed of a composite material including the metal forming the base plate and a ceramic forming the ceramic plate,
wherein the bonding layer comprises:
a first bonding layer that is formed of a first composite material including the metal and the ceramic and provided on the base plate; and
a second bonding layer that is formed of a second composite material including the metal and the ceramic and provided between the first bonding layer and the ceramic plate, and
wherein a composite ratio of the ceramic to the metal in the second composite material is larger than a composite ratio of the ceramic to the metal in the first composite material.

4. The electrostatic chuck according to claim 1,
wherein the ceramic plate comprises:
a first electrode configured to adsorb the object by electrostatic force according to a voltage applied to the first electrode;
a second electrode configured to generate heat according to a voltage applied to the second electrode; and
a ceramic surrounding the first electrode and the second electrode.

5. The electrostatic chuck according to claim 1,
wherein the base plate has a refrigerant channel through which a refrigerant is passed.

6. The electrostatic chuck according to claim 3,
wherein a thickness of the bonding layer is substantially uniform.

7. The electrostatic chuck according to claim 3,
wherein the ceramic plate comprises:
a first electrode configured to adsorb the object by electrostatic force according to a voltage applied to the first electrode;
a second electrode configured to generate heat according to a voltage applied to the second electrode; and
a ceramic surrounding the first electrode and the second electrode.

8. The electrostatic chuck according to claim 3,
wherein the base plate has a refrigerant channel through which a refrigerant is passed.

* * * * *